(12) United States Patent
Holeva

(10) Patent No.: US 6,959,082 B1
(45) Date of Patent: Oct. 25, 2005

(54) METHOD AND SYSTEM FOR AUTOMATIC GAIN CONTROL WITH ADAPTIVE TABLE LOOKUP

(75) Inventor: Lee F. Holeva, Gurnee, IL (US)

(73) Assignee: 3Com Corporation, Marlboro, PA (US)

( * ) Notice: Subject to any disclaimer, the term of this patent is extended or adjusted under 35 U.S.C. 154(b) by 739 days.

(21) Appl. No.: 09/902,213

(22) Filed: Jul. 10, 2001

Related U.S. Application Data

(62) Division of application No. 09/067,144, filed on Apr. 27, 1998.

(51) Int. Cl.[7] ............................................. H04M 1/00
(52) U.S. Cl. ........................ 379/388.03; 379/390.01; 379/390.03
(58) Field of Search .................. 379/388.03, 388.04, 379/390.01, 390.03, 391, 392, 392.01

(56) References Cited

U.S. PATENT DOCUMENTS

| | | | | |
|---|---|---|---|---|
| 5,448,595 A | 9/1995 | Kaku et al. | ................. | 375/345 |
| 5,450,035 A | 9/1995 | Kinoshita | ................... | 330/129 |
| 5,451,948 A | 9/1995 | Jekel | ........................... | 341/139 |
| 5,485,515 A * | 1/1996 | Allen et al. | ............ | 379/392.01 |
| 5,513,387 A | 4/1996 | Saito et al. | ............... | 455/243.1 |
| 5,606,284 A | 2/1997 | Tamesue et al. | ............ | 330/129 |
| 5,606,294 A | 2/1997 | Richards | ..................... | 331/109 |
| 5,617,060 A | 4/1997 | Wilson et al. | .............. | 330/129 |
| 5,666,384 A | 9/1997 | Kuban et al. | ............... | 375/285 |

* cited by examiner

*Primary Examiner*—Jefferey Harold
(74) *Attorney, Agent, or Firm*—McDonnell Boehnen Hulbert & Berghoff LLP

(57) ABSTRACT

A method and system for automatic gain control is provided. The automatic gain control may be used, for example, with a microphone and voice codec of a speakerphone telephone. In an exemplary embodiment, an amplification gain lookup table stores the gain values. The power of the input signal is estimated and the appropriate gain value is selected as a function of the estimated power of the input signal. The gain value is applied to the input signal to provide an automatic gain controlled output signal. In another embodiment, the gain lookup table may be adapted to compensate for the non-linearity of the microphone and voice codec of the speakerphone. In this alternate embodiment, the output power of the automatic gain controlled signal is estimated and compared to a reference signal to generate an error signal. The error signal may be scaled and used to update and dynamically adapt the gain values in the gain lookup table.

12 Claims, 8 Drawing Sheets

AGC as embedded software ial cue.
METHOD AND SYSTEM FOR AUTOMATIC GAIN CONTROL WITH ADAPTIVE TABLE LOOKUP This is a divisional of application Ser. No. 09/067,144, filed Apr. 27, 1998.

FIELD OF INVENTION

This invention relates to automatic gain controls ("AGC"). More specifically, it relates to a method and system for implementing an AGC using a lookup table, and an AGC having the ability to adaptively maintain a desired amplitude output signal.

BACKGROUND OF THE INVENTION

Today, telephones having a speakerphone allowing for hands-free operation or for a number of people in a room to simultaneously communicate on the telephone are being used with increasing frequency. Almost every modern office telephone includes a speakerphone to pickup and transmit sounds without having to use the telephone handset. Such speakerphones allow a number of people to simultaneously converse and interact over a single telephone call.

One problem associated with speakerphones is that the people involved in the conversation will most likely be different distances from the microphone that receives their voices. As a result, the volume of the different speaker's voices will vary with their distance from the microphone. For example, the volume of speakers physically situated near the microphone tends to be loud, while other speakers are barely audible. Simply amplifying the microphone so that the lowest volume speakers can be heard may result in other speaker's voices being over-amplified. This effect can be very distracting, making it difficult to listen and understand the conversation.

In a speakerphone application, automatic gain control ("AGC") circuits can be used to automatically vary the amplification of different speaker's voices to equalize their relative volumes. AGC circuitry is typically employed to maintain a constant amplification gain for electronic circuitry that may otherwise vary over time. Generally, the gain of an electronic circuit may change over time, varying with several factors such as the amplitude or frequency of the input signal, the ambient temperature, as well as other external and internal factors.

A conventional digital AGC implementation utilizes a linear negative feedback loop. Typically, the AGC circuitry amplifies an input signal to provide an output signal level. The AGC circuitry varies the amplification gain to provide the desired output signal level. To determined the appropriate amplification gain, the output signal level is compared to a desired reference signal level and an error signal computed as the difference between the output signal level and the desired reference signal level. The error signal is fed back to adjust the amplification gain such that the output signal level matches the desired reference signal level. Typically, amplification gain adjustments are made proportional to the error signal computed with respect to an estimate of the output power. The output power is determined as an exponentially weighed average over a time constant.

This conventional type of AGC feedback system does not handle voice signals particularly well because it must deal with transitions from a period of significant signal level, such as a voice signal, to a non-signal, such as a period of silence after the transition has already occurred. This conventional system assumes the input is statistically constant, or in other words, wide-sense stationary. An actual voice signal, however, is not constant but varies widely during speech as well as in between periods of speech and non-speech. An automatic gain control employing only feedback compensation may therefore cause the boundaries between intervals of speech and non-speech to become blurred.

SUMMARY OF THE INVENTION

In accordance with an illustrative embodiment of the present invention, problems associated with the automatic gain control ("AGC") of a speakerphone are addressed. The present invention provides an AGC system that can be utilized for equalizing the amplification gain of a speakerphone microphone.

In an illustrative embodiment, an open loop AGC with an amplification gain lookup table to store the appropriate amplification gain values is described. The illustrative embodiment includes a power level estimator, the amplification gain lookup table, and a multiplier. The power level estimator estimates the power level of the input signal and the AGC system selects the appropriate amplification gain from the amplification gain lookup table as a function of the input signal power. The multiplier multiplies the input signal by the amplification gain to provide an AGC output signal.

In another aspect of the invention, the amplification gain lookup table has a gain transfer function providing good signal amplitude control.

Alternatively, the appropriate gain value may be calculated as a direct function evaluation.

In yet another aspect of the invention, the non-signal/signal input condition is detected before application of the gain lookup table.

In another embodiment of the invention, a method for providing automatic gain control is described. The illustrative method includes the steps of estimating the power of the signal, generating a gain value in accordance with the power of the signal, and applying the gain value to the signal to form the automatic gain control signal.

In another embodiment of the invention, a closed loop AGC with the ability to adapt to the particular characteristics of the input signal is described. During operation, the closed loop AGC may learn and compensate for the non-linearity of the AGC system. An illustrative embodiment includes an AGC system, an AGC output power estimation block, an adder and a gain lookup table. The AGC output power estimation block estimates the output power of the AGC system. The adder compares the AGC output power to an amplitude set-point. The difference between the amplitude set-point and the AGC output power is computed as an error signal. The error signal may be scaled by a factor and used to update the gain values in the lookup table. The output signal of the AGC system is used to adapt the amplification gain lookup table to compensate for the particularities of the input signal and the system is adapted as it operates.

In another aspect of the invention, a method of providing an adaptive AGC is described. The exemplary method allows the non-linearity of the system to be learned and compensated.

In yet another embodiment of the invention, executable software code and a computer system with memory is used to implement the AGC system. Alternatively, dedicated hardware is used to implement the AGC system.

The illustrative embodiment provides an AGC system providing good amplitude gain control. The amplification gain table allows the gain level to be selected in a non-linear fashion to provide the most appropriate gain level. In addition, the amplification gain tailor can also be dynamically modified and adapted to compensate for the non-linearity of the system. By combining feed-forward and feedback compensation, the described embodiment can reduce the distortion of speech caused by conventional feedback-only AGC systems.

The foregoing and other features and advantages of an illustrative embodiment of the present invention will be more readily apparent from the following detailed description, which proceeds with references to the accompanying drawings.

DETAILED DESCRIPTION OF AN ILLUSTRATIVE EMBODIMENT

Figure 1:
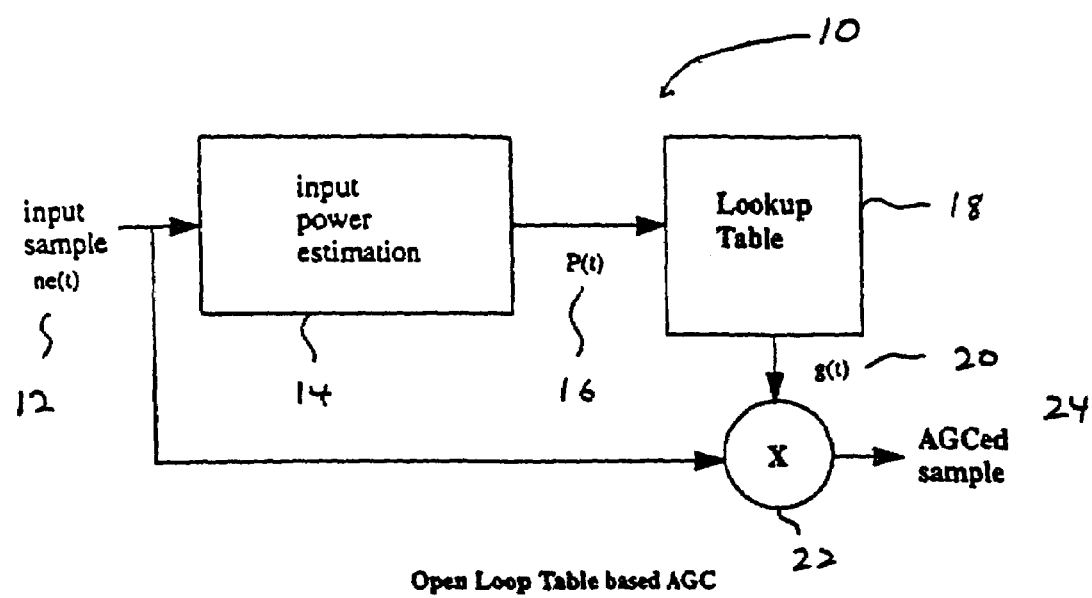
FIG. 1 shows a block diagram illustrating an open loop embodiment of the present invention.

FIG. 1 is a block diagram of an illustrative embodiment of the invention describing an open loop AGC system. The input sample signal ne(t) 12 is fed to an input power estimation block 14 to estimate the power $P_{in}(t)$ 16 of the input signal 12. In an exemplary speakerphone application, the input sample signal ne(t) 12 is typically a digitally sampled voice signal provided from a microphone and voice codec combination. The microphone receives the speaker(s) voices and the voice codec preferably converts the analog microphone signal to a digitally sampled pulse code modulated ("PCM") signal. In North America, mu-law companding converts the analog signal into an 8-bit sample at 8000 samples per second into a 64 kilobit per second digital signal.

In an illustrative embodiment, the estimated power $P_{in}(t)$ 16 is preferably formed over a particular duration of time, as determined by the power estimation or AGC time constant. The input power estimation block 14 preferably estimates the signal power $P_{in}(t)$ 16 of the input sample signal 12 using a single pole filter of the form:

$$P_{in}(t+1)=(1-a)P_{in}(t)+a\,ne_{in}(t)|0<\alpha<1$$

Alpha ($\alpha$) determines the AGC time constant. The smaller the value of alpha, the larger the time constant, and consequentially a greater degree of signal amplitude fluctuations is permitted. Alternatively, other methods for estimating the input signal power, such as replacing the absolute value operation by a squaring operation, may be used.

The estimated power $P_{in}(t)$ 16 of the input sample signal ne(t) 12 is then used to form an address to access the gain lookup table 18 to obtain the appropriate amplification gain value g(t) 20 as a function of the input signal, as will be described in more detail. Preferably, the gain lookup table 18 provides a plurality of gain values that can be applied to the input signal.

Figure 2:
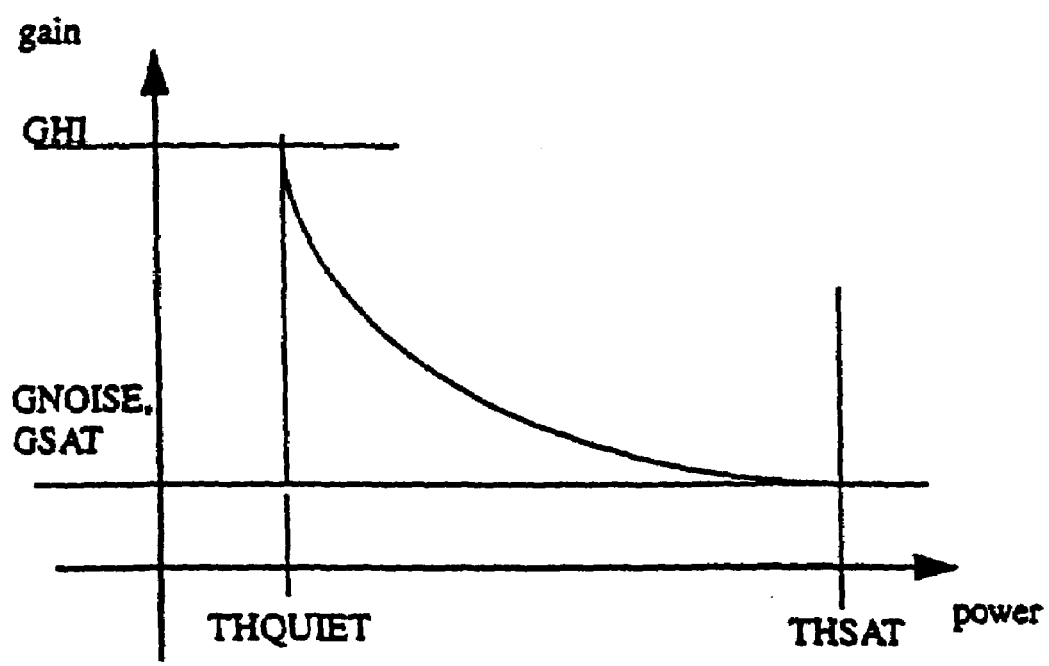
FIG. 2 illustrates a transfer function of a gain lookup table providing good signal amplification used in the system of FIG. 1.

FIG. 2 shows an exemplary transfer function of a gain lookup table 18 containing amplification gain values that provide good signal amplitude control. In this exemplary embodiment, if the input sample signal ne(t) 12 level is either below a noise level, THQUIET, or above a saturation level, THSAT, the gain lookup table 18 provides a fixed gain value, GHI and GSAT respectively. In-between the THQUIET and THSAT levels, the gain values can be selected by the following exemplary function:

$$g(t)=GHI\,\exp(-b(P_{in}(t)-THQUIET))$$

$$b = \frac{\log GHI - \log GSAT}{THSAT - THQUIET}$$

Where:

| | |
|---|---|
| GHI | the maximum gain |
| GSAT | the minimum gain |
| THSAT | the power level at minimum gain |
| THQUIET | the noise power threshold |
| b | the gain curve slope satisfying the condition g(THSAT) = GSAT. |

The negative exponential function for calculating the gain level g(t) provides a good approximation to the inverse transfer characteristics of the microphone-codec combination. Due to effects of saturation, as the input signal nears its maximal value, the output signal will asymptotically approach a constant value. One minus a negative exponential is a good model of this behavior. One possible inverse function is then the negative exponential.

The calculated gain values g(t) are stored at the appropriate address locations in the gain lookup table 18. The gain lookup table 18 is preferably a computer data structure such as an addressable data array stored in computer memory.

The input signal power $P_{in}(t)$ 16, an estimated value in the present embodiment, is used to form an address accessing the gain lookup table 18 to index and retrieve the appropriate gain setting. Accordingly, the appropriate gain value g(t) 20 is selected as a function of the power of the input signal. For example, an estimated input power signal 16 can be converted to a table index to index the gain table 18 using fractional arithmetic. For example the following function can be evaluated:

$$q(t) = \left(\frac{TABLE\_SIZE-1}{THSAT-THQUIET-1}\right)(P_{in}(t)-THQUIET)$$

The result of the function evaluation can be rounded and the high 16-bits cast to an unsigned integer. The resulting 16-bit integer is an index into the gain table. The index may be added to a base address, such as the address of the gain table in memory, to form a memory address. The function provides a linear index into the gain table for input power estimates greater then the quiet level. Due to the finite precision of the arithmetic, input power levels are truncated to the nearest table entry. To conserve on the amount of computer memory required to store the gain lookup table 18, the gain lookup table 18 is preferably implemented to be smaller than the total possible range of gain values. Interpolation between points may be used to derive points not in stored in the gain lookup table, but is not required. Alternately, some form of interpolation, either linear, polynomial, or with spines, could be used to give gain values lying in between the actual table entries.

In an alternative embodiment, direct function evaluation can be employed as an alternative to the gain lookup table 18. The function corresponding to the desired gain table can be evaluated at the value of the estimated input signal sample power $P_{in}(t)$ 16 to calculate the appropriate gain setting g(t) 20. Preferably, the function evaluation is performed by programming the function with computer software running on a computer processor. This alternate embodiment may require additional computing power to evaluate the function, but may save on the amount of computer memory otherwise occupied by the gain lookup table 12 and any memory access latency delay in accessing the memory table.

Each amplification gain value g(t) 20 extracted from the gain lookup table 18 is then applied to the original input sample signal ne(t) 12 value to produce the AGC controlled output sample value 24. A multiplier 22 can be used to multiply the input sample 12 by the gain value 20 to form the AGC output.

In the open loop embodiment 10 described in connection with FIG. 1, the gain slope set by the constant b can be chosen empirically according to the operating characteristics of the system, the choice of parameter values, GHI, GSAT, GNOISE, THQUIET, and THSAT.

Figure 3:
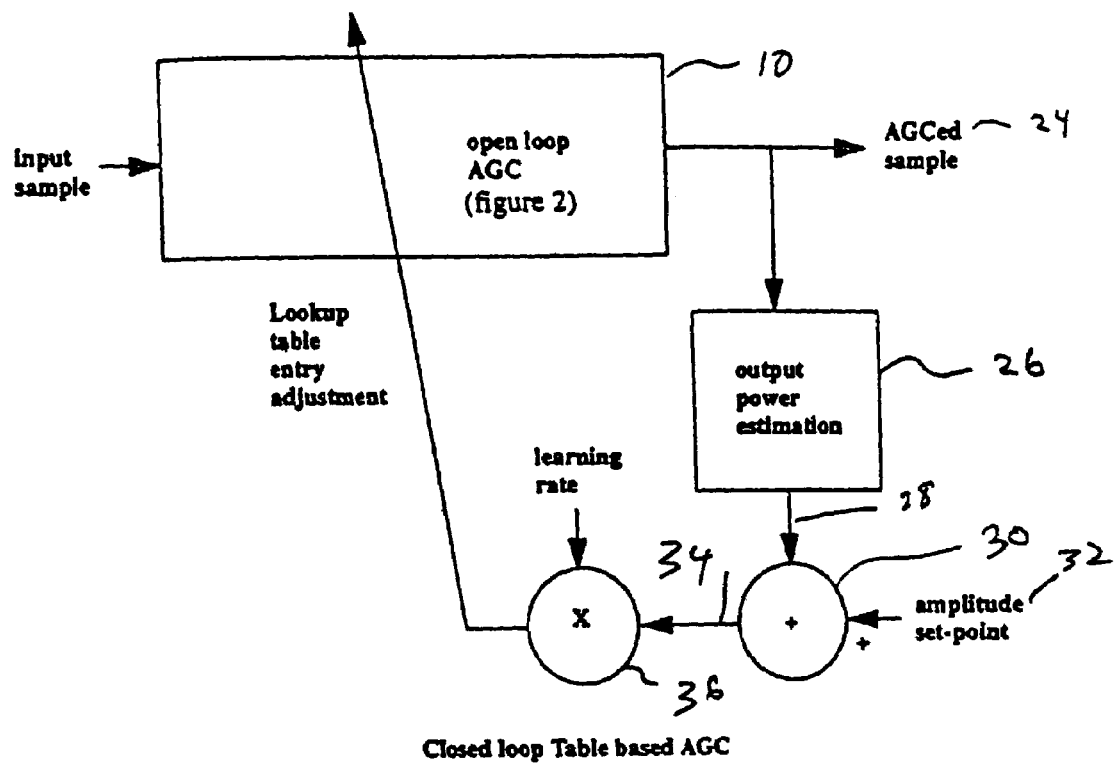
FIG. 3 shows a block diagram illustrating a closed loop embodiment of the present invention.

FIG. 3 shows an exemplary closed loop embodiment of the table driven AGC with the ability to adapt the gain lookup table 18 (FIG. 1). Preferably, the gain lookup table 18 is dynamically adapted according to the input sample signal ne(t) 12 and the AGC output sample value 24. In this preferred embodiment, the gain lookup table 18 is adapted as the AGC system operates on input sample signal ne(t) 12. As the AGC system operates, the non-linearity of the system, typically the non-linear conversion of the voice codec in the speakerphone example, is learned and the gain lookup table 18 dynamically adapted to compensate for any non-linearity of the AGC system. Thus, lookup table adaptation and AGC signal control can occur simultaneously.

The exemplary closed loop embodiment includes an AGC system such as the open loop embodiment 10 shown in FIG. 1. The AGC output sample value 24 of FIG. 1 is supplied to an output power block 26. The output power block 26 determines the output power of the of the output sample value 24. In a preferred embodiment, the output power block 26 is an power estimation block which estimates the output power $P_{out}(t)$ 28 of the output sample value 24 in the same manner as which the input power estimation block 14 (FIG. 1) estimates the power of the input sample signal 12. Preferably, a single pole filter and the identical time constant are used. The estimated output power 28 is used to adapt the gain lookup table 18 according to the actual non-linearity of the AGC system 10.

The entries of the gain lookup table 18 are then adapted based on the estimated output power 28 according to the following exemplary function:

$$G_{new}(q) = G_{old}(q) + \beta(\text{set-point} - P_{out}(t)) \quad 0 < \beta < 1$$

An error signal 34 is determined using adder 30. In a preferred embodiment, the error signal 34 is calculated from the difference between a reference signal or amplitude set-point value 32 and the estimated output power $P_{out}(t)$ 28.

In this preferred embodiment, the error signal 34 is also scaled by a beta factor. The beta factor may act as both a proportionality factor and a learning rate to cause small adjustments of the gain table entries. Too large a table adjustment, say by using a large beta factor, may cause an undesirable sign change in the table. The table adjustments need to be kept small enough so that the gain table entries remain positive. To adapt the automatic gain control, gain lookup table 18 is modified by the scaled error signal. The scaled error signal 34 is added to the present gain value $G_{old}(q)$ in the gain lookup table 18 (FIG. 1) to determine an adapted gain $G_{new}(q)$ value. The adapted gain $G_{new}(q)$ is substituted into the gain lookup table 18 to adapt the AGC system 10. Table entries in the gain lookup table 18 are thus updated one entry at a time as the AGC system 10 operates according to the previous equation. The q in equation refers to the table index referenced by the input power estimate 16. AGC processing in the closed loop embodiment proceeds from sample input, to gain lookup, to a gain table entry update. Eventually the entire gain lookup table 18 can be modified.

The gain table as initially described by the negative exponential function is used as an initial estimate for the microphone-codec inverse transfer function. By allowing the AGC to dynamically modify the table, a more exact inverse transfer function may be obtained and consequentially amplitude control may be extended over a larger range. After a period of time, the AGC does a better job of controlling the signal amplitude.

Figure 4:
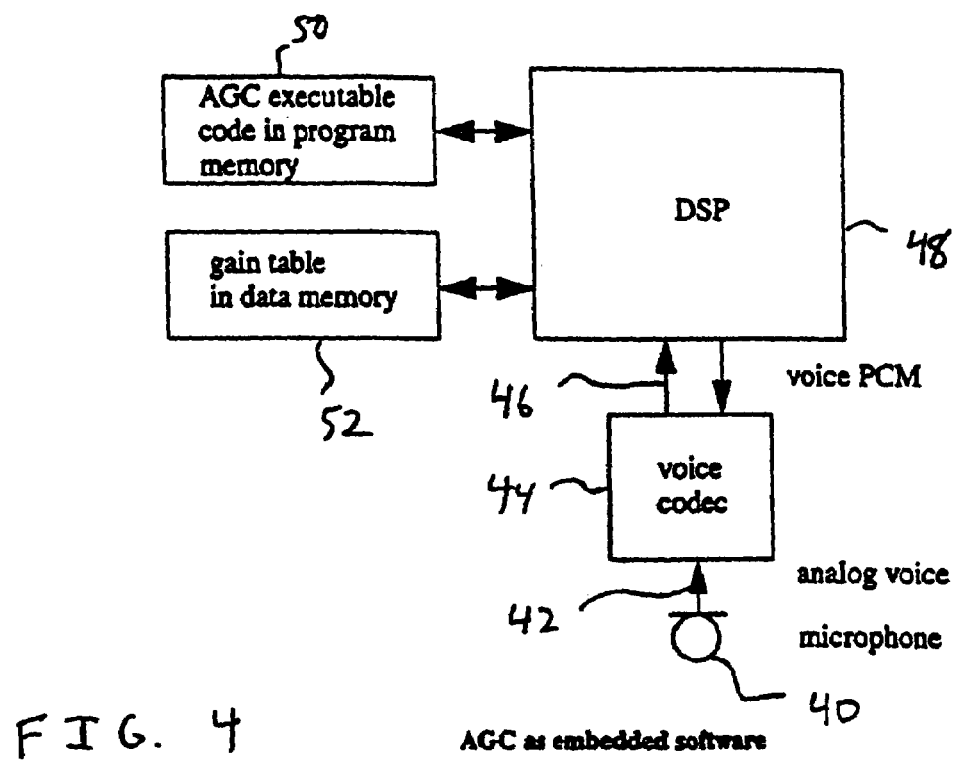
FIG. 4 shows a flow chart illustrating a method in accordance with the closed loop embodiment of FIG. 3.

FIG. 4 shows another illustrative embodiment, wherein the AGC is embodied in the form of executable code 50 running on a processing system with a high-speed Central Processing Unit ("CPU") 48 and a memory system 52. In the preferred embodiment, a special-purpose digital signal processor ("DSP") 48 is depicted, but it should be understood that a general-purpose processor may also be suitable in the present embodiment. In accordance with the practices of persons skilled in the art of computer programming, the present invention is described below with reference to acts and symbolic representations of operations that are performed by the computer processing system, unless indicated otherwise. Such acts and operations are sometimes referred to as being "computer-executed", or "CPU executed."

It will be appreciated that any symbolically represented operations or acts described include the manipulation of electrical signals by the CPU 48. The electrical system represent data bits which cause a resulting transformation or reduction of the electrical signal representation, and the maintenance of data bits at memory locations in the memory system to thereby reconfigure or otherwise alter the CPU's 48 operation, as well as other processing of signals. The memory locations where data bits are maintained also include physical locations that have particular electrical, magnetic, optical, or organic properties corresponding to the stored data bits.

The data bits may also be maintained on a computer readable medium including magnetic disks, optical disks, organic disks, and any other volatile or (e.g., Random Access memory ("RAM")) non-volatile (e.g., Read Only Memory ("ROM")) storage system readable by the CPU. The computer readable medium includes cooperating or interconnected computer readable media, which exist exclusively on a processing system or is distributed among multiple interconnected processing systems that may be local or remote to the processing system.

The present embodiment preferably includes a software module as a set of computer executable software instructions 50. The software instructions 50 are executed as data bits by the CPU 48 with a computer memory system 52. The software instructions 50 cause CPU 48 to accesses the gain lookup table preferably stored in data memory 52. In an alternate embodiment, the software instructions may evaluate a function to calculate the appropriate amplification gain without requiring an access to a gain lookup table stored in memory 52.

The executable code 50 may implement, for example, the methods described in further detail below. In this illustrative embodiment, the gain lookup table 18 (FIG. 1) is stored in a computer memory 52 accessible by the CPU 48. The input signal 46 is voice pulse code modulation ("PCM") signals from a telephony voice codec 44. The voice codec 44 receives analog voice signals 42 from a microphone 40. The voice codec 44 preferably converts the analog signals 42 into a digital PCM signal 46. In North America mu-law companding converts the analog signal into an 8-bit sample at 8000 samples per second into a 64 kilobit per second digital signal 46. In Europe, the A-law compander, as known to those of skill in the art, is used.

The digital PCM signal 46 is then sent to the CPU 48 to execute the software code 50 implementing the described AGC method.

Figure 5:
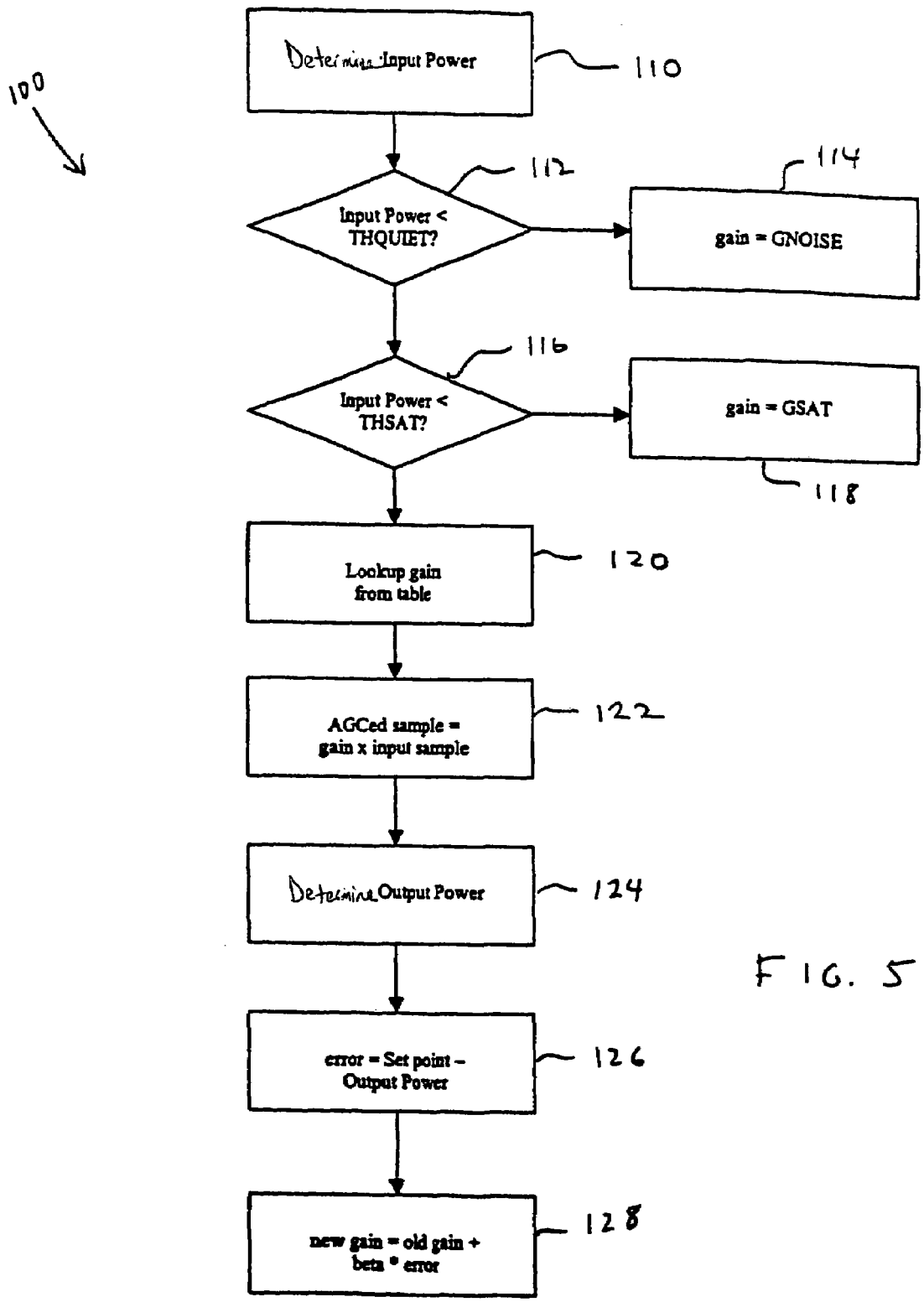
FIG. 5 shows a block diagram illustrating a computer processor based embodiment of the present invention.

FIG. 5 shows a flow chart of the closed loop AGC process 100. At step 110, the power of the input sample signal is determined. In a preferred embodiment, the power of the input signal is estimated to form an estimated input signal power $P_{in}(t)$ 16 (FIG. 1) using a single pole filter such as described above. It should be understood that other techniques of estimating the input signal power may be used as known by those of skill in the art.

At step 112, if the input signal power (estimated) 16 is less than a threshold THQUIET level, the gain value is set equal to a fixed level, GNOISE at step 114. Values of the AGC system parameters are hardware dependent and are not easily calculated. Rather, experiments can be performed to empirically determine the suitable values. Such an experiment would consist of setting initial values to the system parameters, observing the AGC signal output, followed by the adjustment of the system parameter values. Once the signal output is judged to be satisfactory, the parameter adjustment stops. Criteria for signal quality include the extent of amplitude control and the degree of signal distortion. For a given set of hardware, typical values for THQUIET and GNOISE are 75 and 0.1, respectively.

At step 116, the input signal power $P_{in}(t)$ is compared to a second threshold THSAT. If the input signal power $P_{in}(t)$ is greater than the second threshold THQUIET, the gain is set to a fixed level, GSAT at step 118. Of course, THSAT is selected to be greater than THQUIET. For a given set of hardware, values for THSAT and GSAT are respectively 32000 and 0.008.

At step 120, the estimated input signal power $P_{in}(t)$ is a value in between THQUIET and THSAT (THQUIET<$P_{in}(t)$<THSAT). The appropriate gain value is then selected from the gain lookup table 18 (FIG. 1). The gain lookup table may use a transfer function, for example, the transfer function of FIG. 2 previously described. Again, as an alternative to the gain lookup table, the appropriate gain may be determined by direct evaluation of the appropriate transfer function previously described.

At step 122, the input sample is scaled by the gain value to form the AGC sample. The input sample is multiplied by the gain value to form an AGC sample output signal that is AGC controlled.

This exemplary method also allows dynamic adaptation of the AGC system to compensate for any non-linearity of the system. At step 124, the output power of the AGC sample output is estimated in a manner similar to the estimating of the power of the input sample signal. Preferably, a single pole filter and appropriate time constant is used.

At step 126, the error signal is calculated to be equal to an amplitude set-point less (minus) the estimated sample output power.

At step 128, the new gain value for the lookup storage table is determined. The new gain value is calculated to be the error signal scaled by a beta factor, plus the present gain value in the gain lookup table. The gain lookup table is then adapted by storing the new gain value into the appropriate gain lookup table. In this fashion, the gain lookup table is adapted according to the input signal.

It should be understood that the programs, processes, methods and apparatus described herein are not related or limited to any particular type of computer or network apparatus (hardware or software), unless indicated otherwise. Various types of general purpose or specialized computer apparatus may be used with or perform operations in accordance with the teachings described herein.

In view of the wide variety of embodiments to which the principles of the present invention can be applied, it should be understood that the illustrated embodiments are exemplary only, and should not be taken as limiting the scope of the present invention. For example, the steps of the flow diagrams may be taken in sequences other than those described, and more or fewer elements may be used in the block diagrams.

Figure 6:
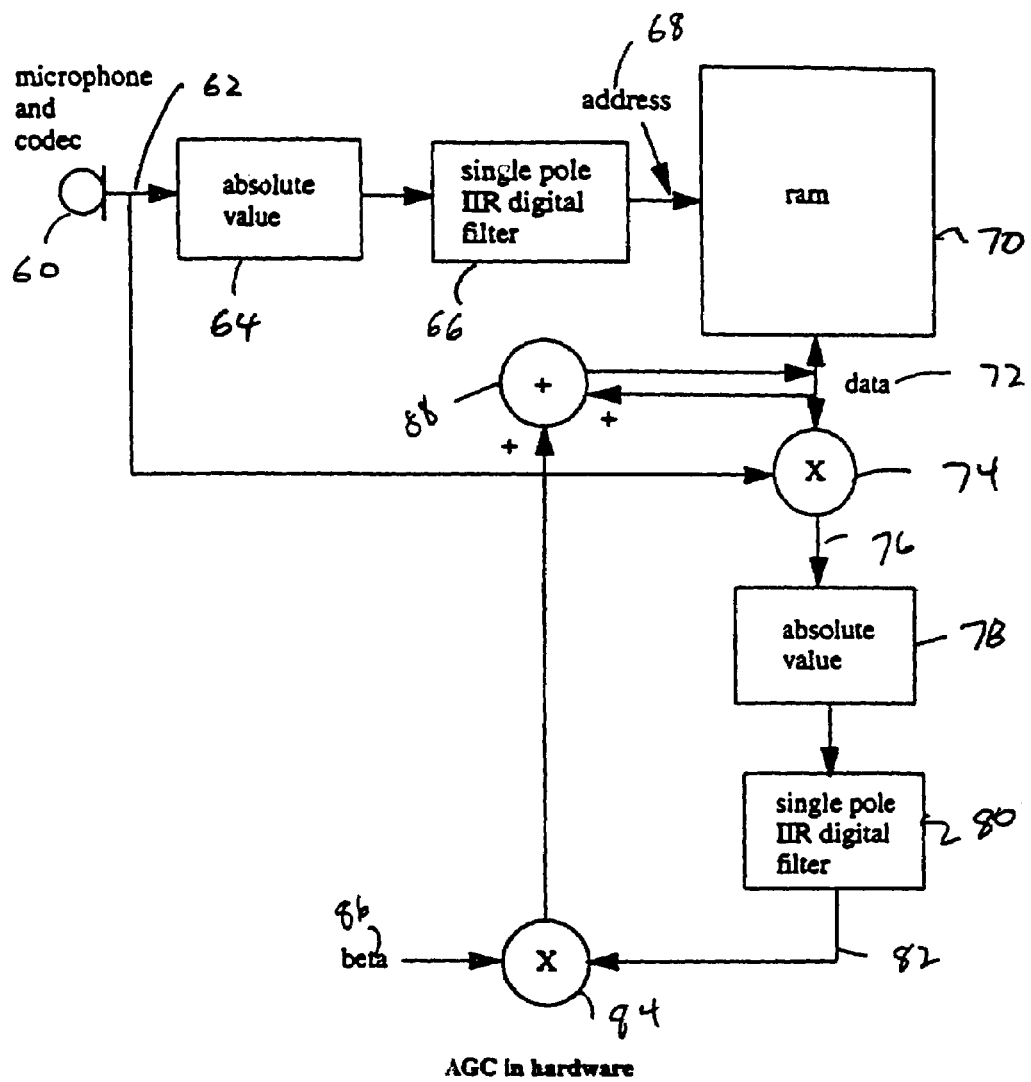
FIG. 6 shows a block diagram illustrating a hardware embodiment of the present invention.

FIG. 6 shows another illustrative hardware embodiment in accordance with the principles of the present invention. The input signal 62 of the microphone/codec 60 is supplied to an absolute value circuit 64 to determine the absolute value of the input sample signal 62. The absolute value circuit 64 can be implemented in a variety of ways including combinational logic or even with computer software or firmware. The absolute value of the input signal is fed to a power estimator 66, embodied as single pole digital filter, to determine the input signal power. For example, the power estimator 66 may implement the function described previously in reference to FIG. 3 to estimate the input signal power. The estimated input signal power is used to form an address 68 to access the gain lookup table stored in RAM 70. The address may be calculated as a function of the input signal power using the function described previously in reference to FIG. 3.

The gain lookup table stored in RAM 70 may be implemented, for example, as the gain lookup table described in connection with FIGS. 1 and 2. The gain lookup table returns the appropriate gain value g(t) in the form of data 72. The gain value data 72 is used to scale the input signal 62 to form the AGC output. Multiplier 74 multiplies the input sample signal 62 by the gain value data 72 to form an AGC output sample signal 76.

To adapt the gain lookup table stored in RAM 70, the absolute value circuit 78 and power estimator 80, preferably in the form of a single pole filter processes the AGC output sample signal 76, to estimate the AGC output sample signal power 82. Multiplier 84 scales the estimated AGC output sample signal power 82 by a beta 86 which is added by adder 88 to update the gain lookup table stored in RAM 70. In this particular embodiment, the multiplier 84 may be formed by combinational logic, exclusive-OR logic gates, shift registers, and buffers. Adder 88 modifies the gain lookup table according to the function:

$$G_{new}(q) = G_{old}(q) + \beta(\text{set-point} - P_{out}(t)) \quad 0 < \beta < 1$$

as previously described in connection with FIG. 3.

It should be understood that a hardware embodiment may take a variety of different forms. The hardware may be implemented as an integrated circuit with custom gate arrays or an application specific integrated circuit ("ASIC"). Of the course, the embodiment may also be implemented with discrete hardware components and circuitry.

Figure 7:
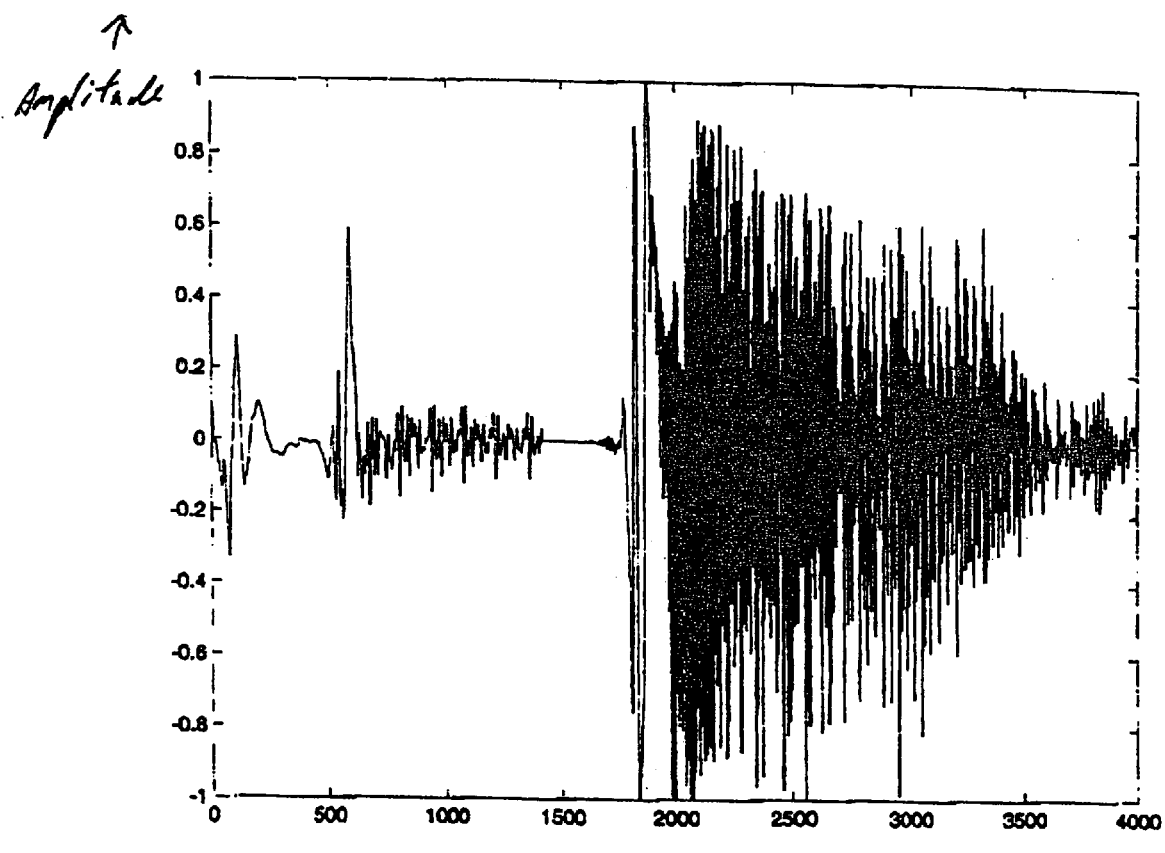
FIGS. 7 and 8 show diagrams of signals before and after application of the AGC.
Figure 8:
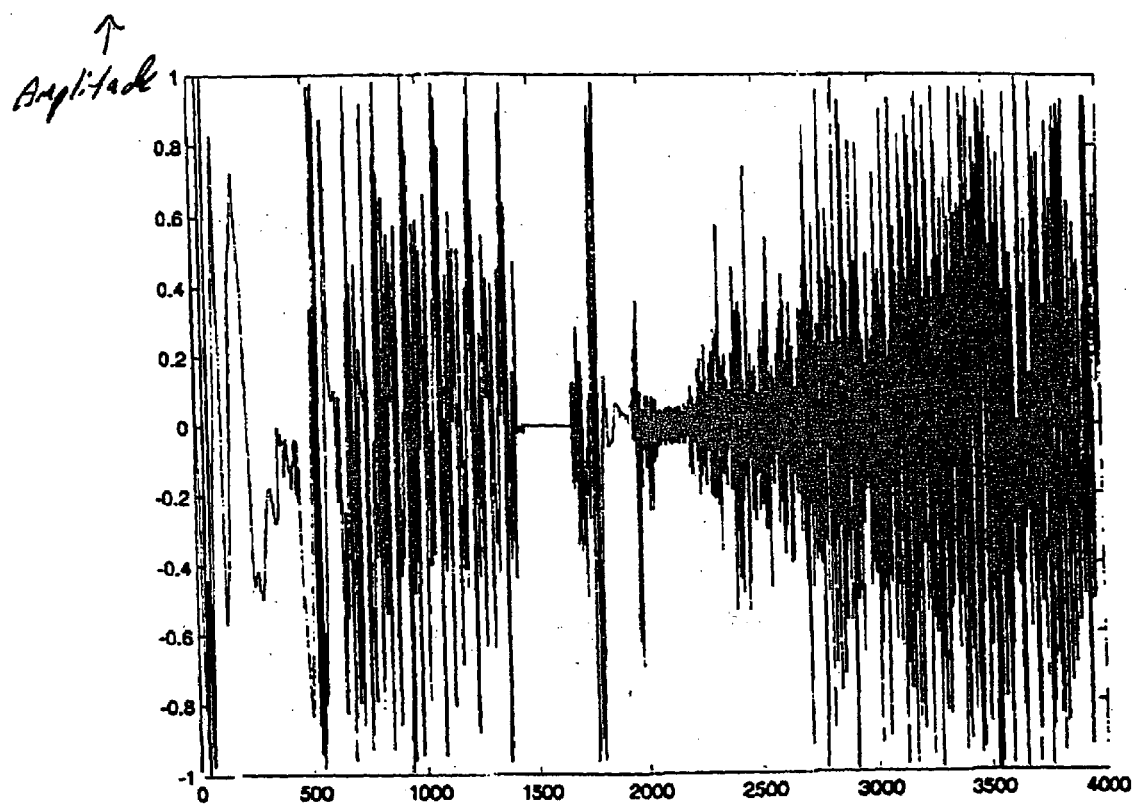

Referring to FIGS. 7 and 8, the before and after results of the AGC of the present embodiment is shown. For these experiments the power estimation time constant was set to match duration of the voiced intervals of speech. Noticeable in FIGS. 7 and 8 is the large range of amplitude control with the preservation of periods of silence.

The claims should not be read as limited to the described order or elements unless stated to that effect. In addition, use of the term "means" in any claim is intended to invoke 35 U.S.C. § 1§12, paragraph 6, and any claim without the word "means" is not so intended. Therefore, all embodiments that come within the scope and spirit of the following claims and equivalents thereto are claimed as the invention.

I claim:

1. An automatic gain control ("AGC") for providing automatic gain control with an adaptive gain level comprising:
   an automatic gain control circuit to provide an automatic gain controlled output signal;
   an output power block for providing output power of the automatic gain controlled output signal;
   an adder for determining an error signal in accordance with the output power of the automatic gain controlled output signal; and
   a gain lookup table for storing gain values, wherein (i) the gain table is adapted in accordance with the error signal; and (ii) the gain table is capable of providing the gain values in accordance with an index formed by a function comprising:

$$q(t) = \left(\frac{TABLE\_SIZE - 1}{THSAT - THQUIET - 1}\right)(P_{in}(t) - THQUIET)$$

wherein TABLE_SIZE comprises a number of entries in the gain; THSAT and THQUIET comprise threshold levels, and $P_{in}(t)$ comprises an input power level.

2. A method of providing an automatic gain control system comprising a gain lookup table with an adaptive gain level comprising the steps of:
   providing an automatic gain controlled output;
   estimating an output power of the automatic gain control system;
   forming an error signal in accordance with the output power of the automatic gain control system;
   generating an address to access the gain lookup table as a function of an input power level where the function comprises:

$$q(t) = \left(\frac{TABLE\_SIZE - 1}{THSAT - THQUIET - 1}\right)(P_{in}(t) - THQUIET)$$

wherein TABLE_SIZE comprises a number of entries in the gain, $P_{in}(t)$ comprises the input power level; and THSAT and THQUIET comprise threshold levels; and
   adapting the gain lookup table in accordance with the error signal.

3. An automatic gain control ("AGC") for providing automatic gain control with an adaptive gain level comprising:
   an automatic gain control circuit to provide an automatic gain controlled output signal;
   an output power block for providing the output power of the automatic gain controlled output signal;
   an adder for determining an error signal in accordance with the output power of the automatic gain controlled output signal; and
   a gain lookup table for storing gain values wherein the gain table is adapted in accordance with the error signal, wherein the gain values are set in accordance with a function comprising:

$$g(t) = GHI \exp(-b(P_{in}(t) - THQUIET))$$

$$b = \frac{\log GHI - \log GSAT}{THSAT - THQUIET}$$

wherein g(t) comprises the gain values, GHI, GSAT are fixed gain levels, and THSAT, THQUIET are threshold values.

4. The AGC of claim 3 wherein THQUIET is approximately 75, GNOISE is approximately 0.1, THSAT is approximately 32000, and GSAT is approximately 0.008.

5. A method for providing an automatic gain control system comprising a gain lookup table with an adaptive gain level comprising the steps of:
   providing an automatic gain controlled output;
   estimating an output power of the automatic gain control system;
   calculating an error signal in accordance with the output power of the automatic gain control system; and
   adapting the gain lookup table in accordance with the error signal, wherein gain values of the gain lookup table are set in accordance with a function comprising:

$$g(t) = GHI \exp(-b(P_{in}(t) - THQUIET))$$

$$b = \frac{\log GHI - \log GSAT}{THSAT - THQUIET}$$

wherein g(t) comprises the gain values, GHI, GSAT are fixed gain levels, and THSAT, THQUIET are threshold values.

6. The method of claim 5 wherein THQUIET is approximately 75, GNOISE is approximately 0.1, THSAT is approximately 32000, and GSAT is approximately 0.008.

7. An automatic gain control ("AGC") for providing automatic gain control with an adaptive gain level comprising:
   an automatic gain control circuit to provide an automatic gain controlled output signal;
   an output power block for providing the output power of the automatic gain controlled output signal;
   an adder for determining an error signal in accordance with the output power of the automatic gain controlled output signal; and
   a gain lookup table for storing gain values, wherein the gain table is adapted in accordance with the error signal, wherein the gain table is adapted with a new gain value, $G_{new}(q)$ that is computed in accordance with the scaled output signal $P_{out}(t)$ comprising the following function:

$$G_{new}(q)=G_{old}(q)+\beta(\text{set-point}-P_{out}(t));$$

wherein β is a scaling factor 0<β<1, the set-point is a desired reference level, $P_{out}(t)$ comprises the output power of the automatic gain controlled output signal, and $G_{old}(q)$ comprises a gain table value.

8. A method of providing an automatic gain control system comprising a gain lookup table with an adaptive gain level comprising the steps of:
providing an automatic gain controlled output;
estimating an output power of the automatic gain control system;
calculating an error signal in accordance with the output power of the automatic gain control system; and
adapting the gain lookup table in accordance with the error signal, wherein the step of adapting adapts the gain lookup table with $G_{new}(q)$ that is computed in accordance with the scaled output signal $P_{out}(t)$ comprising the following function:

$$G_{new}(q)=G_{old}(q)+\beta(\text{setpoint}-P_{out}(t)),$$

wherein β is a scaling factor 0<β<1, the set-point is a desired reference level, $P_{out}(t)$ comprises the output power of the automatic gain controlled output signal, and $G_{old}(q)$ comprises a gain table value.

9. An automatic gain control ("AGC") for providing automatic gain control with an adaptive gain level comprising:
an automatic gain control circuit to provide an automatic gain controlled output signal;
an output power block for providing the output power of the automatic gain controlled output signal, wherein the output power block comprises a function formed by $P_{out}(t+1)=(1-\alpha)P_{out}(t)+\alpha|ne_{out}(t)|$ where 0<α<1, $ne_{out}$ comprises an output signal level, and $P_{out}$ comprises an output power level;
an adder for determining an error signal in accordance with the output power of the automatic gain controlled output signal; and
a gain lookup table for storing gain values, wherein the gain table is adapted in accordance with the error signal.

10. A method of providing an automatic gain control system comprising a gain lookup table with an adaptive gain level comprising the steps of:
providing an automatic gain controlled output;
estimating an output power of the automatic gain control system using a single pole filter comprising:

$$P_{out}(t+1)=(1-\alpha)P_{out}(t)+\alpha|ne_{out}(t)|$$

wherein 0<α<1; t comprises a time variable; $P_{out}$ comprises an output power level; $ne_{out}$ comprises an output signal level; and α comprises a time constant;

calculating an error signal in accordance with the output power of the automatic gain control system; and
adapting the gain lookup table in accordance with the error signal.

11. An automatic gain control ("AGC") for providing automatic gain control with an adaptive gain level comprising:
an automatic gain control circuit to provide an automatic gain controlled output signal;
an output power block for providing the output power of the automatic gain controlled output signal;
an adder for determining an error signal in accordance with the output power of the automatic gain controlled output signal; and
a gain lookup table for storing gain values, wherein the gain table is adapted in accordance with the error signal, and wherein an input power level forms an index to access the gain lookup table,
wherein the index q(t) to access the gain lookup table is formed by a function comprising:

$$q(t)=\left(\frac{TABLE\_SIZE-1}{THSAT-THQUIET-1}\right)(P_{in}(t)-THQUIET)$$

wherein TABLE_SIZE comprises a number of entries in the gain; THSAT and THQUIET comprise threshold levels, and $P_{in}(t)$ comprises an input power level.

12. A method of providing an automatic gain control system comprising a gain lookup table with an adaptive gain level comprising the steps of:
providing an automatic gain controlled output;
estimating an output power of the automatic gain control system;
calculating an error signal in accordance with the output power of the automatic gain control system; and
adapting the gain lookup table in accordance with the error signal by forming an address to access the gain lookup table as a function of an input power level, wherein forming the address q(t) comprises a function:

$$q(t)=\left(\frac{TABLE\_SIZE-1}{THSAT-THQUIET-1}\right)(P_{in}(t)-THQUIET)$$

wherein TABLE_SIZE comprises a number of entries in the gain lookup table, $P_{in}(t)$ comprises the input power level, and THSAT and THQUIET comprise threshold levels.

* * * * *